United States Patent [19]

Akagiri et al.

[11] Patent Number: 5,260,980
[45] Date of Patent: Nov. 9, 1993

[54] DIGITAL SIGNAL ENCODER

[75] Inventors: Kenzo Akagiri; Kyoya Tsutsui, both of Kanagawa, Japan

[73] Assignee: Sony Corporation, Tokyo, Japan

[21] Appl. No.: 747,806

[22] Filed: Aug. 20, 1991

[30] Foreign Application Priority Data

Aug. 24, 1990 [JP] Japan .................. 2-221366

[51] Int. Cl.⁵ .............................................. H04B 1/66
[52] U.S. Cl. ........................................ 375/122; 375/25
[58] Field of Search ................ 375/25, 30, 31, 38, 375/122; 381/29, 31; 358/133, 314, 336

[56] References Cited

U.S. PATENT DOCUMENTS

| 4,464,782 | 8/1984 | Beraud et al. ............ 381/31 |
| 4,535,472 | 8/1985 | Tomcik ..................... 375/122 |
| 5,109,417 | 4/1992 | Fielder et al. ............. 375/122 |
| 5,150,387 | 9/1992 | Yoshikawa et al. ....... 375/122 |

FOREIGN PATENT DOCUMENTS 193143  9/1986 European Pat. Off. .
400473 12/1990 European Pat. Off. .

Primary Examiner—Stephen Chin
Attorney, Agent, or Firm—William S. Frommer; Alvin Sinderbrand

[57] ABSTRACT

An apparatus for encoding an input digital signal divides the input digital signal to produce frequency components of increasing bandwidth as the frequency increases, performs blocking on each of the frequency components to produce blocks of decreasing time length as the frequency increases, performs a fast Fourier transformation on each block and quantizes each block using a quantization characteristic set in accordance with a comparison of the energy of each frequency component in each block with a masking spectrum. The masking spectrum includes both a masking effect on the frequency base of the input signal and masking effect on the time base of the input signal and may further include effects of the minimum audible curve of the human hearing sense characteristic. Utilization of both the temporal and frequency masking effects permits reduction in the bit rate of the encoded signal using real time processing and without deterioration in sound quality.

17 Claims, 6 Drawing Sheets

DIGITAL SIGNAL ENCODER

BACKGROUND OF THE INVENTION

1. Field of the Invention

This invention relates to a digital signal encoder for encoding an input digital signal.

2. Description of the Prior Art

In efficient coding of audio or sound signals, etc., there is known a coding technology based on bit allocation (bit assignment) in which an audio or sound input signal, etc. is divided into signal components of a plurality of channels on a time base or a frequency base, and the number of bits is adaptively allocated among respective channels. For example, for the coding technology based on the bit allocation of an audio signal, etc., there are coding technologies such as band division coding (sub-band coding: SBC) in which an audio signal, etc. is divided into signal components in a plurality of frequency bands and coding thereof is separately carried out, so called adaptive transform coding (ATC) for transforming (orthogonal-transforming) a signal on the time base to a signal on the frequency base to thereby divide that signal into signal components in a plurality of frequency bands to adaptively carry out coding every respective bands, so called adaptive predictive coding with adaptive bit allocation (APC-AB) in which the above-mentioned SBC and the so called adaptive predictive coding (APC) are combined to divide a signal into signal components in a plurality of bands and to transform the signal components in respective bands to those in a base band (low frequency band) and thereafter to carry out a linear predictive analysis of a plurality of degrees, to perform predictive coding, and the like.

In recent years, efficient coding techniques in which the so called masking effect in the human hearing sense characteristic is taken into consideration have been frequently employed. The masking effect is a phenomenon in which a signal is masked by another signal, so it cannot be heard. Instances of the masking effect are the masking effect in an audio signal on the time base and the masking effect in a signal on the frequency base.

The masking effect on the frequency base is the effect that a signal component in one frequency band is masked by a signal component in another frequency band, so sounds in the first frequency band cannot be heard. Instances of the masking effect on the time base are the temporal masking effect and the simultaneous masking effect. The simultaneous masking effect is the effect that a small amplitude sound (or noise) occurring simultaneously with a loud, that is, large amplitude sound is masked by the loud sound, so it cannot be heard. Further, the temporal masking effect is the effect that a small amplitude sound (noise) temporally preceding and succeeding a loud sound is masked by the loud sound, so it cannot be heard. The masking backward in time of the loud sound is called a forward masking, and the masking forward in time of the loud sound is called a backward masking. Further, in the temporal masking, with respect to the human hearing sense characteristic, the effect of the forward masking persists for a long time (e.g., about 100 msec.), whereas the effect of the backward masking is effective for only a short time (e.g., about 5 msec.). In addition, the level of the masking effect (masking quantity) is about 20 dB in the case of the forward masking, and is about 30 dB in the case of the backward masking. As stated above, since sound at a portion subjected to masking cannot be heard, even if the number of bits allocated for quantization of a signal component at the portion subjected to masking is reduced during quantization of an audio signal, deterioration in sound quality can be minimized.

Meanwhile, in the above-mentioned efficient coding, it is desirable to allow the bit compression ratio to be higher (reduce the bit rate further). However, generally, in the efficient coding to carry out bit compression by masking use of the masking effect as described above, only one of the masking effect in signals on the frequency base and the masking effect in signals on the time base has been limitatively utilized. Namely, both of the masking effects have not been effectively utilized together.

In addition, in the case of reducing the bit rate in consideration of the masking effect with respect to signals on the time base, it is desirable for effectively utilizing the masking effect on the time base to allow the processing time block length to be long. However, if the processing time block length is long, real time processing becomes difficult.

OBJECTS AND SUMMARY OF THE INVENTION

An object of the present invention is to provide a digital signal encoder which can carry out processing in a short time (real time processing). Another object of the present invention is to provide a digital signal encoder which minimizes deterioration in sound quality by effectively utilizing both the masking effect with respect to signals on the frequency base and the masking effect with respect to signals on the time base, thus permitting the bit rate of an encoded signal to be lower.

An apparatus for encoding input digital signal according to this invention comprises first frequency analysis means for frequency dividing the input signal into frequency components, second frequency analysis means for blocking and frequency analyzing the frequency components to produce blocks of data having analyzed frequency components, first noise level setting means for generating first output signals based on a first allowable noise level set in accordance with an energy of each analyzed frequency component of the blocks of data output within a predetermined time period from the second frequency analysis means, second noise level generating second output signals based on setting means for a second allowable noise level of each analyzed frequency component output within the predetermined time period set in accordance with an energy of at least one of the blocks of data which temporally precede and succeed, respectively, the each block, and for quantizing the blocks of data output from the second frequency analysis means on the basis of a quantization characteristic set in accordance with the first and second output signals. The first frequency analysis means comprises band division means for dividing the input digital signal into the frequency components in a plurality of frequency bands, including at least one filtering means; and the second frequency analysis means includes blocking means for blocking the frequency components in each of the plurality of frequency bands into a respective plurality of blocks, and fast Fourier transform means for carrying out a fast Fourier transformation of the frequency components in each of the plurality of blocks to produce the blocks of data having analyzed frequency components. The band division means produces frequency bands of increasing bandwidth as the frequency of the frequency bands increases, and the blocking means produces blocks of decreasing block time length as the frequency of the frequency band increases. The second noise level setting means sets the second allowable noise level on the basis of at least one block of data temporally preceding the each block. In another aspect of the present invention, each of the blocks of data output from the second frequency analysis means has analyzed frequency components for a particular frequency band, and the second noise level setting means sets the second allowable noise level on the basis of energies of blocks of data which are for the same frequency band as the each block and are for temporally different periods than the each block.

In accordance with yet another aspect of this invention, the first allowable noise level set in accordance with an energy of each of the analyzed frequency components output within a predetermined time period from the second frequency analysis means represents a masking effect on the frequency base of the input digital signal, and the second allowable noise level set in accordance with an energy of at least one of the blocks of data which temporally precede and succeed, respectively, the each block represents a temporal masking effect on the input digital signal. Further, the quantization characteristic of the quantization means is set in accordance with both of the masking effects. Thus, bit compression having less deterioration in sound quality can be carried out. In addition, since the processing for determining the second allowable noise level is carried out temporally preceding or succeeding the processing for determining the first allowable noise level, actual quantization processing time is completed within a predetermined time period, and is a short time.

DESCRIPTION OF THE PREFERRED EMBODIMENT

A preferred embodiment of this invention will now be described with reference to the attached drawings.

Figure 1:
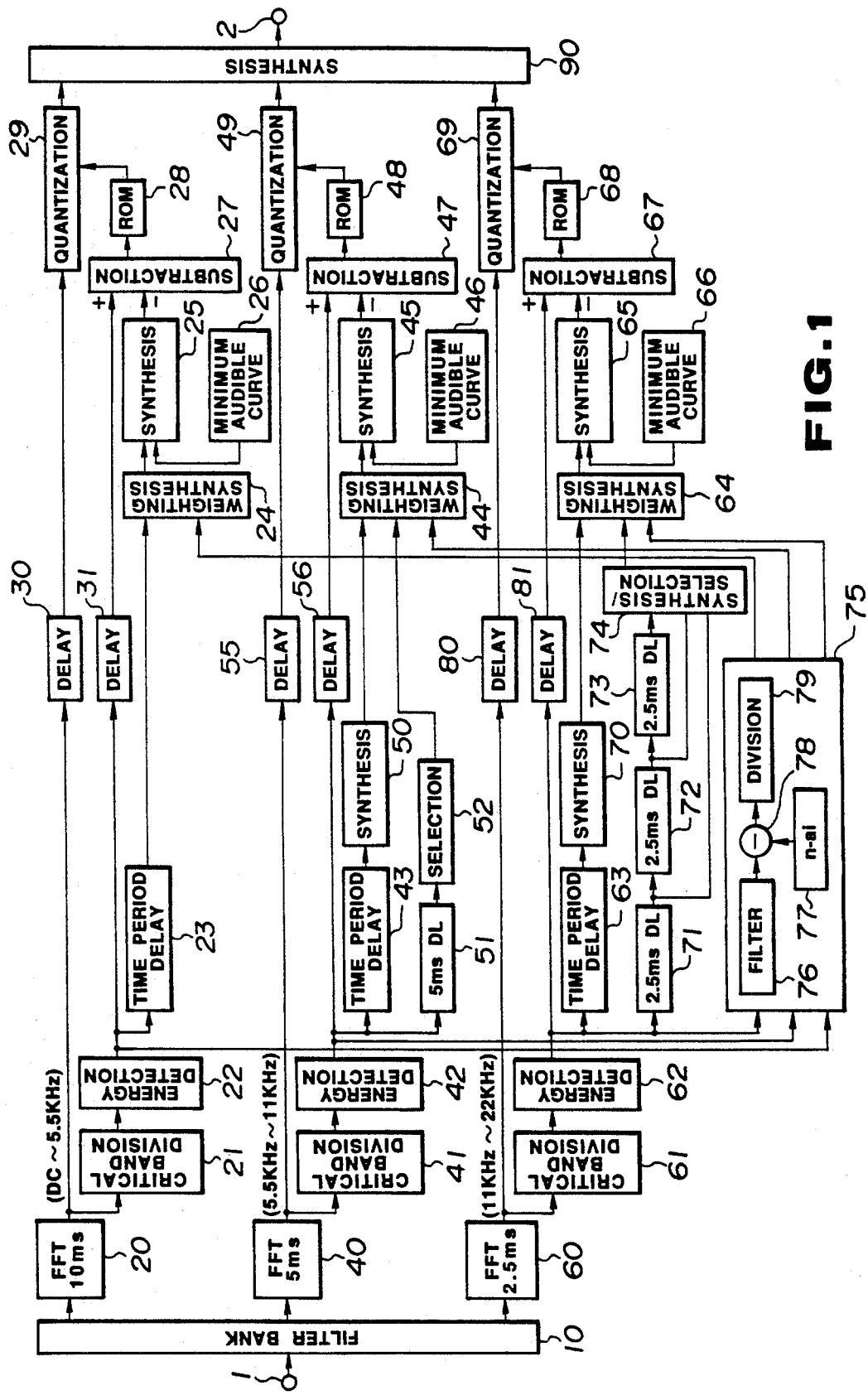
FIG. 1 is a diagram showing, in a block form, the configuration of a digital signal encoder according to an embodiment of the present invention.

A digital signal encoder of this embodiment comprises, as shown in FIG. 1, a filter bank 10 serving as first frequency analysis means for frequency dividing an input digital signal delivered to an input terminal into frequency components, FFT (fast Fourier transform) circuits 20, 40 and 60 serving as second frequency analysis means for blocking and frequency analyzing the frequency components from the filter bank 10, respectively, and quantization circuits 29, 49 and 69 for quantizing respective outputs (FFT coefficient data), that is, blocks of data having analyzed frequency components, from the FFT circuits 20, 40 and 60. This digital signal encoder further comprises a masking spectrum calculation circuit 75 serving as first noise level setting means for generating first output signals based on a first allowable noise level set in accordance with energies of respective frequency components of the blocks of data output within predetermined time periods (e.g., time periods B1-B3 of FIG. 3 which will be described later) from the FFT circuits 20, 40 and 60; and time period delay circuits 23, 43 and 63, synthesis circuits 50 and 70, a 5 ms delay (DL) circuit 51, 2.5 ms delay circuits 71, 72 and 73, a selection circuit 52, a synthesis/selection circuit 74, and weighting synthesis circuits 24, 44 and 64 which together serve as second noise level setting means for generating output signals based o second allowable noise levels of respective frequency components output within the predetermined time period set in accordance with an energy of at least one of the blocks of data which temporally precede and succeed each respective block, thus to set quantization characteristics (quantization bit allocation) of the quantization circuits 29, 49 and 69 on the basis of the first and second output signals. The filter bank 10 comprises band division means for dividing the input digital signal into frequency components in a plurality of frequency bands (three bands in this embodiment), including at least one filter (e.g., a mirror filter such as a so called QMF, etc.). The above-mentioned FFT circuits 20, 40 and 60 serve to carry out a fast Fourier transformation of the frequency components in each of the blocks. The band division means (filter bank 10) produces frequency bands of increasing bandwidth as the frequency of the frequency bands increases. The FFT circuits 20, 40 and 60 serve as blocking means for producing blocks of decreasing block time length as the frequency of the frequency bands increases. The second noise level setting means sets the second allowable noise level on the basis of at least one block of data temporally preceding the respective block. In addition, the second noise level setting means serves to set the second noise level on the basis of energies of blocks of data which are for the same frequency band as the respective block and are for temporally different periods than the respective block. An output from the encoder of this embodiment is outputted from an output terminal 2.

Figure 2:
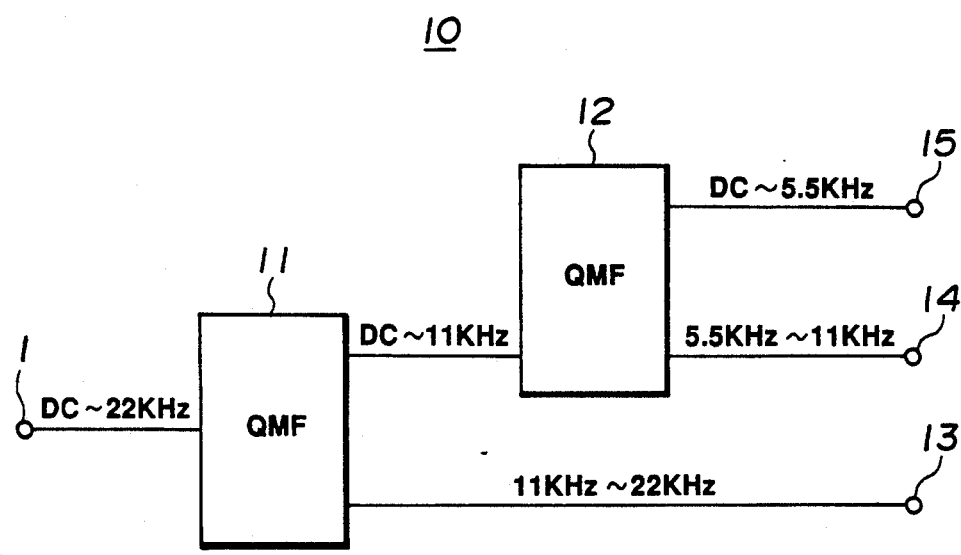
FIG. 2 is a diagram showing, in a block form, an example of the filter bank shown in FIG. 1.

More specifically, in FIG. 1, an input digital sound signal of DC - 22 KHz obtained by sampling, e.g., at the sampling frequency fs=44.1 KHz, is delivered to the input terminal 1. This input digital sound signal is delivered to the filter bank 10. This filter bank 10 has, as shown in FIG. 2, a structure including two stages of quadrature mirror filters (QMFs) 11 and 12 cascade-connected. The input digital sound signal of DC - 22 KHz delivered to the input terminal 1 is delivered to the QMF 11. This QMF 11 serves to divide the input digital sound signal into signal components in two frequency bands above and below 11 KHz. Accordingly, output signals in the frequency bands of DC - 11 KHz and 11-22 KHz are provided from the QMF 11. The output signal in the frequency band of 11 to 22 KHz is delivered to the FFT circuit 60 through a terminal 13. The output signal in the frequency band of DC - 11 KHz is delivered to the QMF 12. This QMF 12 serves to divide its input signal into signal components in two frequency bands above and below 5.5 KHz. Accordingly, output signals in the frequency bands of DC - 5.5 KHz and 5.5-11 KHz are provided from the QMF 12. The signal in the frequency band of 5.5 to 11 KHz is delivered to the FFT circuit 40 through a terminal 14, and the signal in the frequency band of DC - 5.5 KHz is delivered to the FFT circuit 20 through a terminal 15. Thus, in the filter bank 10 serving as the first frequency analysis means, an input digital sound signal is divided into signal components in three frequency bands using a division such that the bandwidth increases as the frequency of the frequency band increases. It is to be noted that while the filter is comprised of QMFs in the example of FIG. 2, there may be employed a structure using BPFs (band-pass filters).

In the FFT circuit 20 supplied with a signal in the frequency band of DC - 5.5 KHz from the filter bank 10, the signal delivered thereto is divided into signal components in the form of blocks every 10 ms and FFT processing is carried out for every block. Further, in the FFT circuit 40 supplied with a signal in the frequency band of 5.5-11 KHz, FFT processing on a block basis is carried out every 5 ms. In addition, in the FFT circuit 60 supplied with a signal in the frequency band of 11 to 22 KHz, FFT processing on a block basis is carried out every 2.5 ms. Namely, in these FFT circuits 20, 40 and 60 serving as the second frequency analysis means, blocking such that the block length subjected to FFT decreases as the frequency of the frequency band increases is carried out. As stated above, in this embodiment, in forming blocks at respective FFT circuits 20, 40 and 60, there is employed an approach to carry out blocking such that the block time length is decreased at a higher frequency band to thereby allow the time resolution at the higher frequency band to be high and allow the time resolution at a lower frequency band to be low while decreasing the bandwidth of a frequency band within one block at the lower frequency band, thus allowing the frequency resolution at the low frequency band to be high. Namely, since ordinary sound signals have a short steady state period at a high frequency band, it is effective that the time resolution at a high frequency band is caused to be high as described above. Further, since the frequency resolution in the hearing sense of the human being is generally high at a low frequency band, it is also effective that the frequency resolution at a low frequency band is caused to be high as described above.

Figure 3:
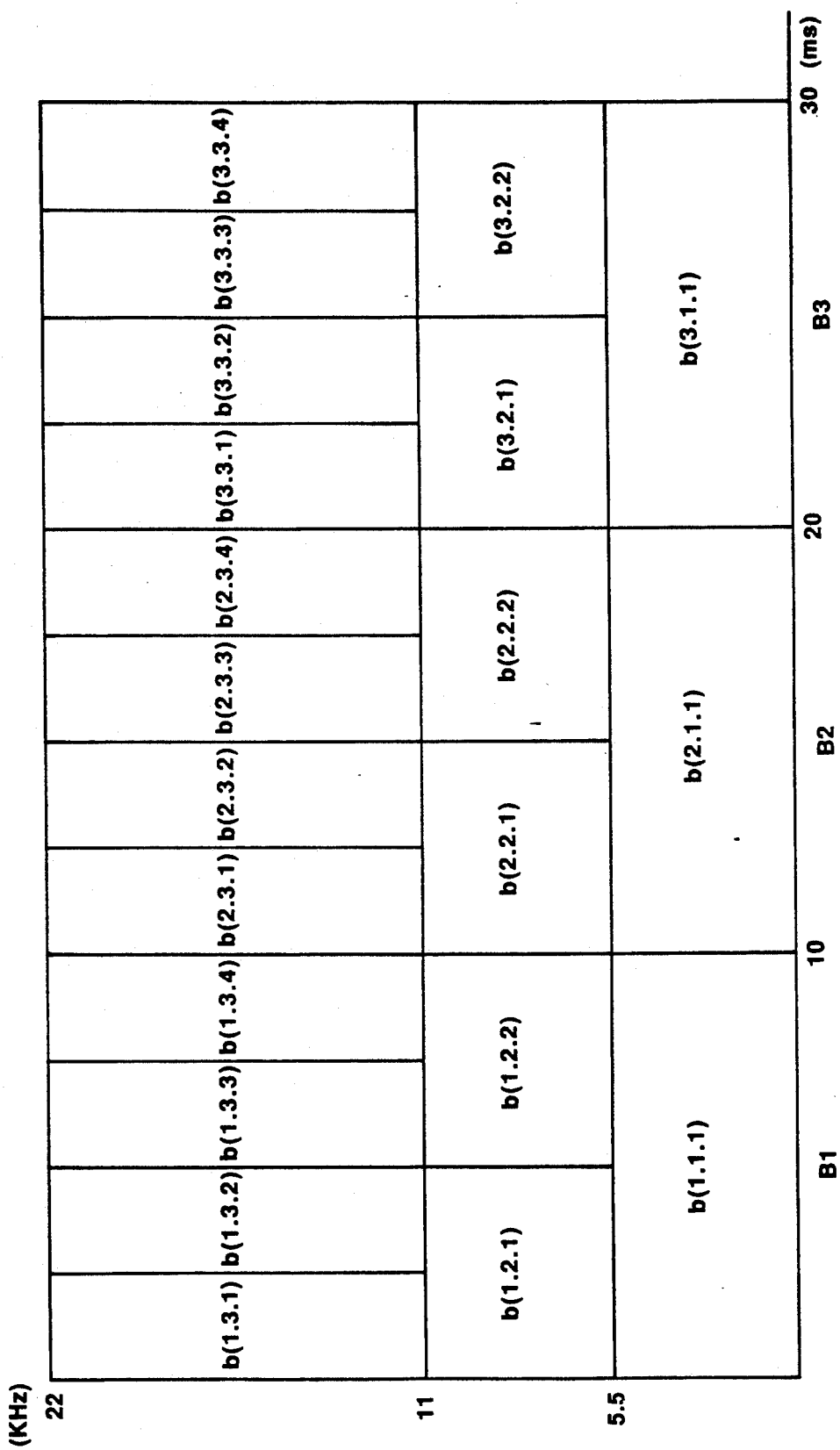
FIG. 3 is a diagram used in explaining the time blocks used in respective frequency bands.

Frequency band division and blocking by the filter bank 10 and the respective FFT circuits 20, 40 and 60 is shown in FIG. 3. Namely, in FIG. 3, there are shown the band division and respective processing units (blocks) of FFT data. Respective blocks are designated by three parameters of p, q and r in a block b (p, q, r) in the figure where p represents a time elapsed, q represents a band, and r represents a time block. In FIG. 3, it is indicated that one time block in each band has a time length (time resolution) of 10 ms at the lower frequency band of DC - 5.5 KHz. Further, it is also indicated that one block time length is 5 ms in the medium frequency band of 5.5-11 KHz and that one block time length is 2.5 ms at the high frequency band of 11-22 KHz.

FFT coefficient data for each of the frequency bands obtained by FFT processing in the FFT circuits 20, 40 and 60 are delivered to the above-mentioned quantization circuits 29, 49 and 69, at Which the data are quantized. At this time, for example, every respective predetermined time periods B1-B3 of FIG. 3, quantization processing is carried out. In this quantization, there is carried out an adaptive quantization in which the quantization characteristic (bit allocation) of quantization is changed on the basic of outputs from the first and second noise level setting means obtained in consideration of the masking effect with respect to signals o the frequency base and the masking effect with respect to signals on the time base as described later. It is here noted that the respective predetermined time periods B1-B3 are set to 10 ms which is the minimum unit of the processing at the FFT circuit 20.

The above-mentioned first and second allowable noise levels for carrying out such an adaptive quantization are practically determined as follows.

Output data of the FFT circuits 20, 40 and 60 are further divided into data in so called critical bands. Namely, the critical band mentioned here is a band in which the human hearing sense characteristic is taken into consideration. More particularly, when a pure sound is masked by a narrow band noise having the same intensity including a pitch of the pure sound, the critical band refers to a band of a masking noise such that the bandwidth becomes broad according as the frequency of the frequency band increases. In this embodiment, such a critical band division is employed to thereby allow the bandwidth to increase as the frequency of the frequency band increases thus to divide the band concerned into, e.g., 25 bands. To carry out this, output data (frequency band DC - 5.5 KHz) from the FFT circuit 20 is further divided into data in, e.g., 20 bands in the low frequency band of the critical band concerned by the critical band division circuit 21. Further, output data (5.5-11 KHz) from the FFT circuit 40 is further divided into data in, e.g., three bands in a medium frequency band of the critical band concerned by the critical band division circuit 41. In addition, output data (11-22 KHz) from the FFT circuit 60 is further divided into data in, e.g., two bands in a high frequency band of the critical band concerned by the critical band division circuit 61.

Figure 4:
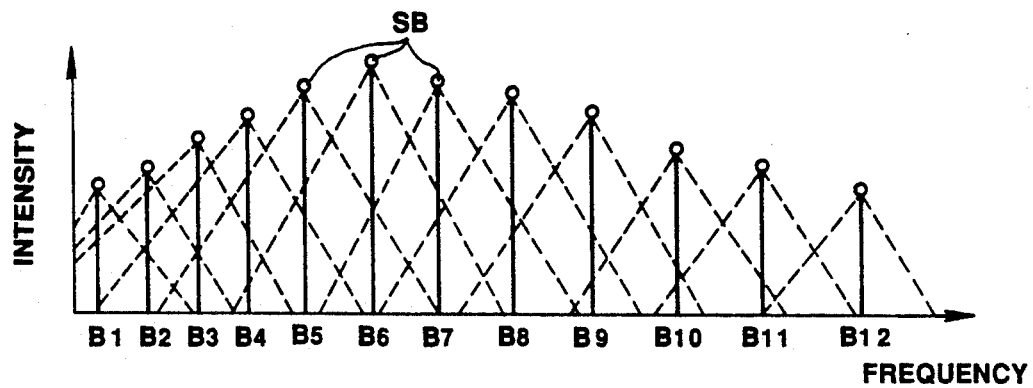
FIG. 4 is a diagram showing the bark spectrum.

Outputs from the critical band division circuits 21, 41 and 61 are delivered to energy detection circuits 22, 42 and 62, respectively. In the respective energy detection circuits 22, 42 and 62, energies (spectrum intensities in respective bands) of FFT data for the analyzed frequency components in each of the respective time blocks at the respective critical bands obtained from the output of the FFT circuits 20, 40 and 60 are determined, for example, by taking a sum total of amplitude values, of the analyzed frequency components in respective bands (the peak or average of the amplitude value, or energy sum total). Outputs from the energy detection circuits 22, 42 and 62, i.e., spectrum of the sum total across all respective critical bands is generally called a bark spectrum. Bark spectrum SB in each band is as shown in FIG. 4, for example. It is to be noted that the above-mentioned critical band concerned is represented as 12 bands for brevity of explanation in FIG. 4.

Figure 5:
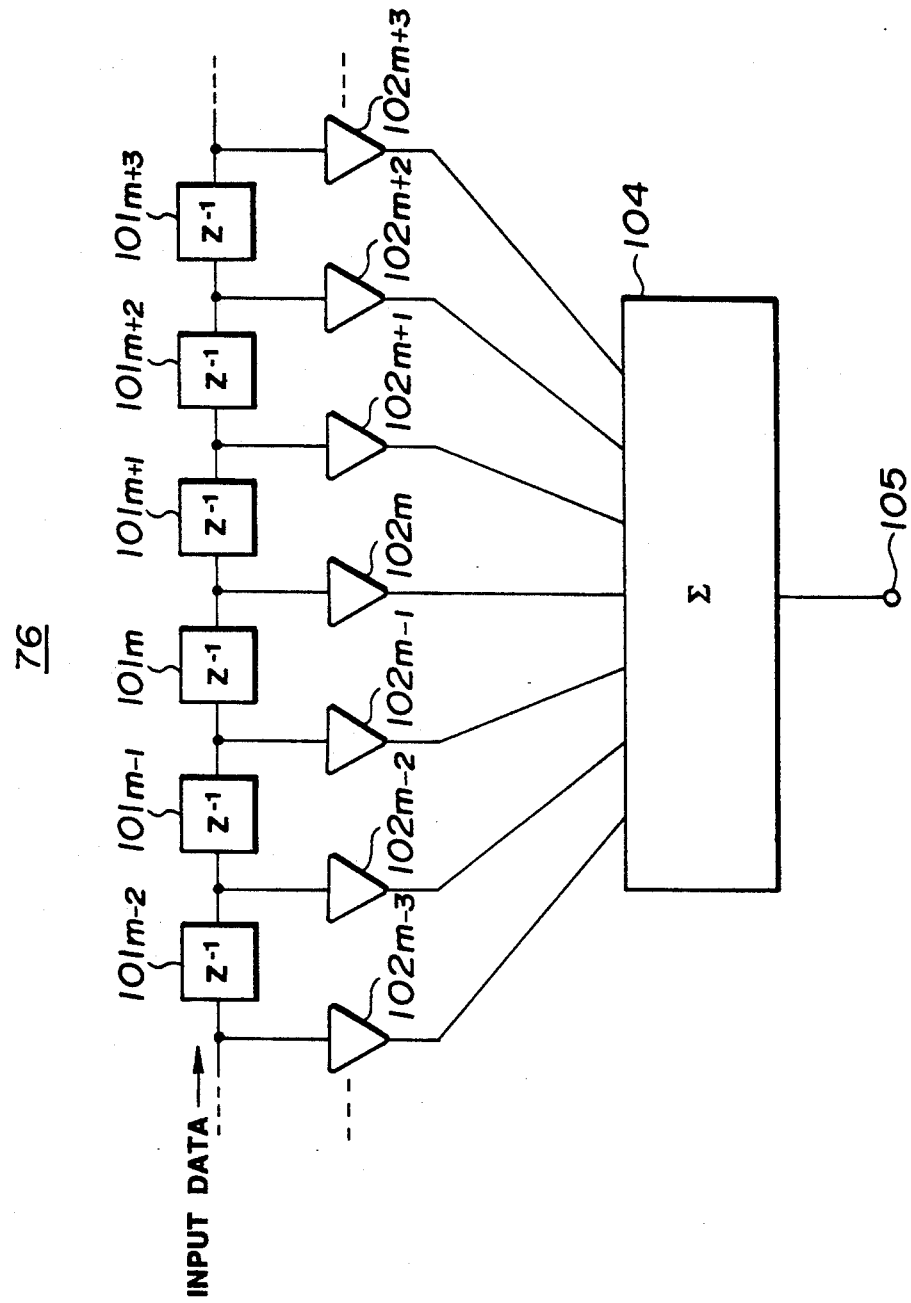
FIG. 5 is a diagram showing the filter circuit of FIG. 1 in detail.

Here, in order to allow the influence in the masking on the frequency base of the above-mentioned bark spectrum SB to be taken into consideration, a predetermined weighting function is convolved onto the bark spectrum SB by convolution processing. To realize this, outputs from the energy detection circuits 22, 42 and 62, i.e., respective values of the bark spectrum SB are delivered to the masking spectrum calculation circuits 75 serving as the first noise level setting means. Each of the masking spectrum calculation circuits 75 includes a filter circuit 76, a function generation circuit 77, a subtracter 78, and a divider 79 respectively corresponding to the energy detection circuits 22, 42 and 62. Accordingly, each of outputs from the energy detection circuits 22, 42 and 62 is delivered to one of the filter circuits 76. This filter circuit 76 is, as shown in FIG. 5, for example, composed of delay ($Z^{-1}$) elements $101_{m-2}$-$101_{m+3}$ for delaying input data in sequence, multipliers $102_{m-3}$-$102_{m+3}$ for multiplying outputs from respective delay elements by a respective filter coefficient (weighting function), and a sum total adder 104. At the respective multipliers $102_{m-3}$-$102_{m+3}$, the convolution processing of the bark spectrum SB is carried out as follows. For example, at the multiplier $102_{m-3}$, outputs from respective energy detection circuits are multiplied by the filter coefficient 0.0000086; at the multiplier $102_{m-2}$, outputs from I7 respective delay elements are multiplied by the filter coefficient 0.0019; at the multiplier $102_{m-1}$, those outputs are multiplied by the filter coefficient 0.15; at the multiplier $102_m$, those outputs are multiplied by the filter coefficient 1; at the multiplier $102_{m+1}$; those outputs are multiplied by the filter coefficient 0.4; at the multiplier $102_{m+2}$, those outputs are multiplied by the filter coefficient 0.06; and at the multiplier $102_{m+3}$, those outputs are multiplied by the filter coefficient 0.007. By the convolution processing mentioned above, a sum total of the portions indicated by dotted lines in FIG. 4 (addition at the sum total adder 104) is obtained. The sum total thus provided is outputted from an output terminal 105.

Meanwhile, in the level $\alpha$ corresponding to the first allowable noise in the case of calculating the masking spectrum of the bark spectrum SB (allowable noise spectrum), if the level $\alpha$ is small, the masking spectrum (masking curve) with respect to signals on the frequency base will be lowered. As a result, the number of bits allocated during quantization at the quantization circuits 29, 49 and 69 must be increased. In contrast, if the above-mentioned level $\alpha$ is large, the masking spectrum will be raised. As a result, the number of bits allocated during quantization can be decreased. It is to be noted that the level $\alpha$ corresponding to the first allowable noise level refers to a level such that there results the first allowable noise level in every band of the critical band concerned by carrying out deconvolution processing as described later. Further, generally in audio signals, etc., the spectrum intensity (energy) at the high frequency band portion is small. Accordingly, in this embodiment, a technique is adopted to take the above circumstances into consideration by allowing the level $\alpha$ to be larger according as the frequency of the frequency band increases to a higher frequency where the energy is small, thus to decrease the number of bits allocated at the high frequency band portion. From the above point of view, at the masking spectrum calculation circuit 75, the above-mentioned level $\alpha$ with respect to the same energy is set to a higher value as the frequency increases.

Namely, in the encoder of this embodiment, an approach is employed to calculate the level $\alpha$ corresponding to the first allowable noise level and to conduct a control such that the level becomes high as the frequency of the frequency band increases. To realize this, an output from the filter circuit 76 is delivered to the subtracter 78. This subtracter 78 serves to determine the level $\alpha$ in the convolution-processed region. Here, an allowable function (function representing the masking level) for determining the level $\alpha$ is delivered to the subtracter 78. By increasing and decreasing the allowable function, control of the level $\alpha$ is carried out. This allowable function is delivered from the function generation circuit 77.

Namely, when the number given in sequence from the low frequency band of the critical band is assumed as i, the level $\alpha$ corresponding to the allowable noise level can be determined in accordance with the following equation (1):

$$a = S - (n - ai) \quad (1)$$

In the above equation (1), n and a are constants, respectively, where a $>0$, S is the intensity of the convolution-processed bark spectrum, and (n−ai) in the equation (1) is an allowable function. Here, as described above, since a method of decreasing the number of bits from the high frequency band having less energy is advantageous to reduction of the entire number of bits, n is set to 38 and $\alpha$ is set to 1 in this embodiment. There is no deterioration in sound quality at this time. As a result, satisfactory coding is carried out.

In this way, the above-mentioned level $\alpha$ is determined. This data is transmitted to the divider 79. The divider 79 serves to carry out deconvolution of the level $\alpha$ in the above-mentioned convolution-processed region. Accordingly, by carrying out the deconvolution processing, a masking spectrum can be provided from the level $\alpha$. Namely, this masking spectrum is an allowable noise spectrum determined for every band. It is to be noted that while the above-mentioned deconvolution processing requires a complicated calculation, a simplified divider 79 is used in this embodiment to carry out deconvolution.

Further, in the encoder of this embodiment, the number of bits allocated for quantization in which the above-described masking on the frequency base is taken into consideration is determined, and a second allowable noise level of each frequency component output within a predetermined time period is set in accordance with an energy of at least one of the blocks of data which temporally precede and succeed, respectively, each of the blocks output from the FFT circuits 20, 40 and 60. Namely, assuming that the above-mentioned predetermined period is B2 of FIG. 3, the block of data temporally preceding the block B2 is the block B1, and the block of data temporally succeeding the block B2 is the block B3. On the basis of at least one of these blocks of data for these predetermined periods B1 and B3, an allowable noise level (masking level) with respect to each frequency component within the predetermined period B2 is set. Further, at least one block of data at the second noise level setting means is a block of data temporally preceding the block B2. Namely, by taking into consideration the forward masking in which the masking effect persists for a long time, on the basis of the block of data for the predetermined time period B1 temporally preceding the block B2, an allowable noise level for the block of the predetermined time period B2 is determined. Further, the second noise level setting means sets the second allowable noise level on the basis of energies of blocks of data which are for the same frequency band as the block B2 and are for temporally different periods than the block B2. Namely, the second allowable noise level is set on the basis of energies of blocks of data temporally preceding and succeeding the block B2 and of the same frequency band in the critical bands as the block B2.

In other words, in the second noise level setting means, by taking into consideration the temporal masking by signals preceding and succeeding (for preceding and succeeding predetermined time periods B1 and B3) on the time base adjacent on the time base to a signal at a current time point (e.g., a predetermined time B2) of an arbitrary band where the first allowable noise level is set by the masking spectrum calculation circuit 75 with respect to the signal at the current time point (the predetermined time B2) of the arbitrary band, an allowable noise level (second allowable noise level) for an arbitrary band at the current time point (predetermined time B2) is set. To realize this, each of outputs from the energy detection circuits 22, 42 and 62 is delivered to the time period delay circuits 23, 43 and 63 and the 5 ms delay circuit 51, and the 2.5 ms delay circuit 71 of the second noise level setting means.

Here, these period delay circuits 23, 43 and 63 serve to delay data respectively delivered thereto every time period of, e.g., 10 ms which is the processing unit for the predetermined time period. Further, outputs from the time period delay circuits 43 and 63 are delivered to synthesis circuits 50 and 70 respectively. These synthesis circuits 50 and 70 synthesize data of the shorter time blocks (5 ms, 2.5 ms blocks) generated at the FFT circuits 40 and 60 so that they become in correspondence with data of 10 ms, respectively. Further, the 5 ms delay circuit 51 serves to carry out delay for every 5 ms block. An output from the 5 ms delay circuit 51 is delivered to the selection circuit 52. The selection circuit 52 serves to carry out a switching selection such that in the case where data of the 5 ms block delivered thereto is the forward block data within a predetermined time period being processed, that data is caused to be passed therethrough, and in the case where data of the 5 ms block delivered thereto is the backward block data within a preceding time period of the predetermined time period, that data is not passed therethrough. Namely, assuming that the predetermined period being processed is the period B2 of FIG. 3, the selection circuit 52 carries out a selection such that when 5 ms block data delivered thereto is the block b (2, 2, 1) in FIG. 3, that circuit is turned ON, and when the above data is the block b (1, 2, 2), that circuit is turned OFF. The 2.5 ms delay circuit 71 serves to carry out delay every block of 2.5 ms. Outputs from the 2.5 ms delay circuit 71 are delivered in sequence to the 2.5 ms delay circuits 72 and 73. Each of the outputs from the 2.5 ms delay circuits 71, 72 and 73 is delivered to the synthesis/selection circuit 74. This synthesis/selection circuit 74 carries out a switching selection such that in the case where 2.5 ms block data delivered thereto is the backward block b (1, 3, 4) within a preceding predetermined time period of, e.g., the predetermined period B2, that circuit is turned OFF, and in the case where that data is the blocks b (2, 3, 1), b (2, 3, 2) and b (2, 3, 3) within the predetermined time period B2, that circuit is turned ON. At the same time, when, e.g., data of the block b (2, 3, 2) is delivered to the synthesis/selection circuit 74, the synthesis/selection circuit 74 synthesizes this block and the forward block b (2, 3, 1); when data of the block b (2, 3, 3) is delivered to the synthesis/selection circuit 74, it synthesizes this block and the forward two blocks b (2, 3, 1) and b (2, 3, 2); and when data of the block b (2, 3, 4) is delivered to the synthesis/selection circuit 74, it synthesizes this block and the forward three blocks b (2, 3, 1), b (2, 3, 2) and b (2, 3, 3).

An output from the time period delay circuit 23 is delivered to the weighting synthesis circuit 24, outputs from the synthesis circuit 50 and the selection circuit 52 are delivered to the weighting synthesis circuit 44, and outputs from the synthesis circuit 70 and the synthesis/selection circuit 74 are delivered to the weighting synthesis circuit 64. Further, data from the masking spectrum calculation circuit 75 is also delivered to respective weighting synthesis circuits 24, 44 and 64. Here, respective weighting synthesis circuits 24, 44 and 64 serve to synthesize weighting coefficients in which the masking effects on the frequency base and the time base are taken into consideration with respect to data delivered thereto. Namely, these weighting coefficients are coefficients set by taking the masking effect into consideration. For example, in the case where a signal for a predetermined time period and time blocks preceding or succeeding a signal for a current predetermined period and respective time blocks is normalized so that it takes a value of 1, a weighting coefficient corresponding to an influence on the signal for the current predetermined time period and the time blocks based on the masking (masking and temporal masking with respect to a signal on the frequency base, or the like) on the frequency base and on the time base by the signal for the preceding or succeeding predetermined time period and time blocks is weighted with respect to the signal for the preceding or succeeding predetermined time period and time blocks. Thus, the allowable noise level (masking spectrum) utilizing the masking effects on the frequency base and the time base can be set.

It is to be noted that while the above-described masking spectrum in which the masking effect is taken into consideration is determined within the same critical band as the band of the current block, that spectrum can alternatively be a spectrum in which masking between other critical bands is taken into consideration.

Figure 6:
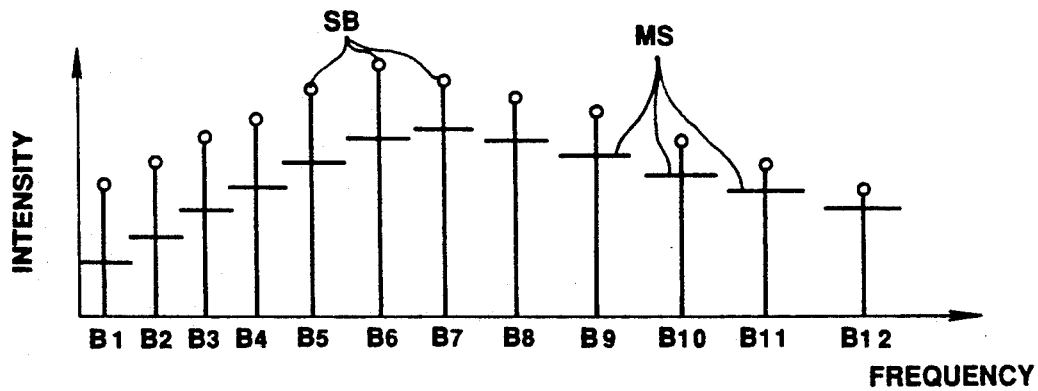
FIG. 6 is a diagram showing the bark spectrum and the masking spectrum.

Outputs from the weighting synthesis circuits 24, 44 and 64 are further delivered through the synthesis circuits 25, 45 and 65 to the subtractors 27, 47 and 67, respectively. Here, to the subtractors 27, 47 and 67, outputs from the respective energy detection circuits 22, 42 and 62, i.e., the previously described bark spectrum SB, are delivered through the delay circuits 31, 56 and 81, respectively. Accordingly, when subtractive calculations between the masking spectrum and the bark spectrum SB of the first and second allowable noise levels are carried out at these subtracters 27, 47 and 67, the portions of the bark spectrum SB below the level indicated by each level of the masking spectrum MS are masked as shown in FIG. 6.

Outputs from the subtracters 27, 47 and 67 are delivered to the quantization circuits 29, 49 and 69 through ROMs 28, 48 and 68, respectively. These ROMs 28, 48 and 68 are adapted to store therein allocation bit number information during quantization at the quantization circuits 29, 49 and 69 and to output allocation bit number information corresponding to outputs from the subtracters 27, 47 67, respectively. Namely, these quantization circuit 29, 49 and 69 quantize FFT coefficient data delivered through the delay circuits 30, 55 and 80 by using allocation bit numbers corresponding to outputs from the respective subtracters 27, 47 and 67. In other words, these quantization circuits 29, 49 and 69 quantize analyzed frequency components of respective bands by using a number of bits allocated in accordance with energy level difference between energies in each of the bands of the critical band allowable noise levels in which the masking effects on the frequency base and the time base are taken into consideration. It is to be noted that this bit allocation number information stored in the ROMs 28, 48 and 68 is not determined anew at each predetermined time period, that is, the number of bits used for respective predetermined time periods is determined in advance. Accordingly, bit allocation is carried out within one predetermined time period. Here, the above-mentioned delay circuits 30, 55 and 80 are provided to compensate for delay quantities at respective circuits following the critical band circuits 21, 41 and 61. Further, the above-mentioned delay circuits 31, 56 and 81 are provided to compensate for delay quantities at respective circuits following the time period delay circuits 23, 43 and 63, the 5 ms delay circuit 51, the 2.5 ms delay circuit 71, and the masking spectrum calculation circuit 75.

Figure 7:
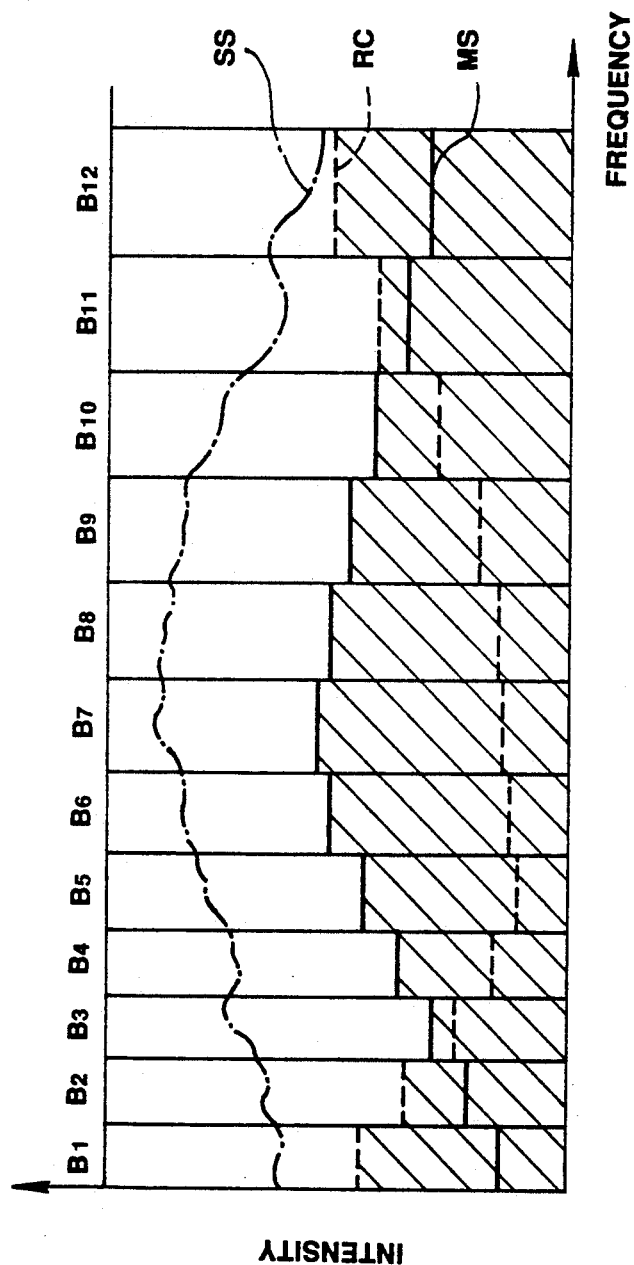
FIG. 7 is a diagram showing the minimum audible curve synthesized with the masking spectrum.

In synthesis at the synthesis circuits 25, 45 and 65, it is possible to synthesize data indicating the so called minimum audible curve (equi-loudness curve) RC of the human hearing sense characteristic as shown in FIG. 7 delivered from minimum audible curve generation circuits 26, 46 and 66 and the above-mentioned masking spectrum. Accordingly, by synthesizing both the minimum audible curve RC and the masking spectrum MS, the allowable noise level can be down to the portion indicated by slanting lines in the figure. Thus, the number of bits allocated to the portion indicated by slanting lines in the figure can be reduced during quantization. FIG. 7 shows also a signal spectrum SS for the time. Further, in this embodiment, there may be employed a configuration such that the above-described synthesis processing of the minimum audible curve is not carried out. In this case, the minimum audible curve generation circuits 26, 46 and 66 and the synthesis circuits 25, 45 and 65 in the configuration of FIG. 1 are unnecessary.

Respective outputs from the quantization circuits 29, 49 and 69 quantized by the adaptive allocation bit number in this way are synthesized at the synthesis circuit 90, and an output thus synthesized is then outputted as a coded output from the output terminal 2.

As described above, the digital signal encoder of this embodiment includes first noise level setting circuit 75 for setting a first allowable noise level in accordance with an energy of each frequency component of the blocks of data output within a predetermined time period from the FFT circuits 20, 40 and 60, and second noise level setting means for setting a second allowable noise level of each frequency component output within the predetermined time period set in accordance with an energy of at least one of the blocks of data which temporally precede and succeed, respectively, the predetermined period of outputs from the FFT circuits 20, 40 and 60 to set quantization characteristics (quantization bit allocations) of the quantization circuits 29, 49 and 69 in accordance with outputs from the first and second noise level setting means thereby making it possible to carry out quantization in which the masking effects on the frequency base and the time base are taken into consideration, resulting in coding having less deterioration in sound quality. Further, the filter bank 10 comprises band division means for dividing the input digital signal into signal components in a plurality of frequency bands, including at least one filter. The FFT circuits 20, 40 and 60 serve to carry out fast Fourier transformations of signals every block. The band division means (filter bank 10) divides the input digital signal such that the bandwidth of the frequency bands increases as the frequency of the bands increases. In addition, the FFT circuits 20, 40 and 60 carry out blocking such that the block time length decreases as the frequency of the bands increases. Accordingly, time resolution is improved at a higher frequency band, and frequency resolution is improved at a lower frequency band. Thus, the processing suitable for a human hearing sense characteristic can be carried out. In addition, at least one block of data used at the second noise level setting means to set the second allowable noise level is a block of data temporally preceding the current block and the second noise level setting means sets each second allowable noise level on the basis of energies of blocks of data which are for the same frequency band as the current block and are for temporally different periods than the current block. Thus, processing can be conducted in a short time.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. An apparatus for encoding an input digital signal, comprising;
    first frequency analysis means for frequency dividing said input digital signal into frequency components,
    second frequency analysis means for blocking and frequency analyzing said frequency components to produce blocks of data having analyzed frequency components,
    first noise level setting means for generating first output signals based on a first allowable noise level set in accordance with an energy of each said analyzed frequency component of said blocks of data output within a predetermined time period from said second frequency analysis means,
    second noise level setting means for generating second output signals based on a second allowable noise level of each said analyzed frequency component output within said predetermined time period set in accordance with an energy of at least one of said blocks of data which temporally precede and succeed, respectively, said each block, and
    quantization means for quantizing said blocks of data output from said second frequency analysis means on the basis of a quantization characteristic set in accordance with said first and second output signals from said first and second noise level setting means, respectively.

2. An apparatus for encoding an input digital signal as set forth in claim 1, wherein said first frequency analysis means comprises band division means for dividing said input digital signal into said frequency components in a plurality of frequency bands, said band division means including at least one filtering means; and said second frequency analysis means includes blocking means for blocking said frequency components in each of said plurality of frequency bands into a respective plurality of blocks, and fast Fourier transform means for carrying out a fast Fourier transformation of said frequency components in each of said plurality of blocks to produce said blocks of data having analyzed frequency components.

3. An apparatus for encoding an input digital signal as set forth in claim 2, wherein said band division means produces frequency bands of increasing bandwidth as the frequency of said frequency bands increases, and said blocking means produces blocks of decreasing block time length as the frequency of said frequency bands increases.

4. An apparatus for encoding as input digital signal as set forth in claim 1, wherein said second noise level setting means sets said second allowable noise level on the basis of at least one block of data temporarlly preceding said each block.

5. An apparatus for encoding an input digital signal as set forth in claim 1, wherein each of said blocks of data output from said second frequency analysis means has analyzed frequency components for a particular frequency band, and said second noise level setting means sets said second allowable noise level on the basis of energies of blocks of data which are for the same frequency band as said each block and are for temporally different periods than said each block.

6. An apparatus for encoding an input digital signal as set forth in claim 1, further comprising critical band division means for dividing a block of data output from said second frequency analysis means into component blocks in critical bands.

7. An apparatus for encoding an input digital signal as set forth in claim 6, wherein said first noise level setting means includes summing means for determining a sum total of amplitude values of said analyzed frequency components of said component blocks in respective critical bands, said sum total representing said energy used to set said first allowable noise level.

8. An apparatus for encoding an input digital signal encoder as set forth in claim 6, wherein said second noise level setting means includes means for setting said second allowable noise level for each of said critical bands.

9. An apparatus for encoding an input digital signal encoder as set forth in claim 8, wherein said means for setting sets said second allowable noise level in one band of said critical bands on the basis of said second allowable noise level in another band of said critical bands.

10. An apparatus for encoding an input digital signal as set forth in claim 6, wherein said quantization characteristic of said quantization means is set in accordance with energy level differences between each of said component blocks in said critical bands and said first and second output signals.

11. An apparatus for encoding an input digital signal as set forth in claim 1, wherein said quantization characteristic of said quantization means decreases the number of bits allocated for quantizing each of said blocks of data as the frequency of the frequency band of said blocks of data increases.

12. An apparatus for encoding an input digital signal as set forth in claim 1, wherein said first allowable noise level represents a masking level on the frequency base of said input digital signal based on a human hearing sense characteristic.

13. An apparatus for encoding an input digital signal as set forth in claim 1, wherein said second allowable noise level represents a masking level on the time base of said input digital signal based on a human hearing sense characteristic.

14. An apparatus for encoding an input digital signal as set forth in claims 12 and 13, further comprising curve generating means for generating a minimum audible curve signal based on a human hearing sense characteristic; synthesis means for synthesizing said minimum audible curve signal with said first and second output signals to generate said synthesized signal; and wherein said quantization characteristic is set in accordance with said synthesized signal.

15. An apparatus for encoding an input digital signal as set forth in claim 2, wherein each said at least one filtering means of said first frequency analysis means is comprised of a mirror filter.

16. An apparatus for encoding an input digital signal as set forth in claim 2, wherein each said at least one filtering means of said first frequency analysis means is comprised of a band-pass filter.

17. An apparatus for encoding an input digital signal according to claim 1, wherein said second noise level setting means generates said second output signals based on said first output signals.

* * * * *